July 24, 1951 W. G. PFANN 2,561,411

SEMICONDUCTOR SIGNAL TRANSLATING DEVICE

Filed March 8, 1950

INVENTOR
W. G. PFANN
BY
[signature]
ATTORNEY

Patented July 24, 1951

2,561,411

UNITED STATES PATENT OFFICE 2,561.411

SEMICONDUCTOR SIGNAL TRANSLATING DEVICE

William G. Pfann, Chatham, N. J., assignor to Bell Telephone Laboratories, Incorporated, New York, N. Y., a corporation of New York Application March 8, 1950, Serial No. 148,376

11 Claims. (Cl. 175—366)

This invention relates to semiconductor signal translating devices and more particularly to semiconductor amplifiers of the type disclosed in Patent 2,524,035, granted October 3, 1950 to J. Bardeen and W. H. Brattain and application Serial No. 130,268, filed November 30, 1949, of W. G. Pfann.

Devices of the type to which this invention pertains comprise, in general, a body of semiconductive material, such as germanium, and emitter, collector and base connections to the body. In the operation of such devices, amplified replicas of signals impressed upon the emitter are obtained in a utilization circuit connected to the collector. The gain may be of current or power, or both.

One general object of this invention is to improve the performance characteristics of semiconductor signal translating devices.

More specific objects of this invention are to improve the frequency response characteristic of such devices, to control, specifically to reduce the positive feedback in semiconductor amplifiers, thereby to enhance the stability thereof, and to facilitate control of the gain of such amplifiers.

In the operation of semiconductor amplifiers, charge carriers of sign opposite that of those normally present in excess in the body are injected at the emitter and flow through the body to the collector thereby to effect changes in the collector current. Specifically if the body is of N conductivity type material, the injected carriers are holes and are drawn toward the negatively biased collector. The magnitude of the collector current is dependent upon, inter alia, the number of holes which flow to the collector and the phase relations involved in the hole flow. These relations are dependent upon the hole transit times and thus, in turn, upon the lengths of the paths traversed thereby in passing from the emitter to the collector region. This phenomenon has placed a restriction upon the upper limit of frequency at which the amplifier can be operated to particular advantage.

The collector current flows through the body, between the base and the collector, over a path a portion of which is common to the path for the emitter current. Thus, there obtains common to the input and output circuit an impedance of such character as to engender positive feedback. Such feedback leads to instability.

In accordance with one feature of this invention, the semiconductive body is provided with regions or zones of prescribed different conductivities so related with the electrodes that the paths for carrier flow from emitter to collector are substantially constrained and the impedance common to the emitter and collector circuits is minimized.

In accordance with another feature of this invention, an auxiliary electrode is provided for controlling the flow of carriers between the emitter and collector to vary the gain.

In one specific illustrative embodiment of this invention, a semiconductor amplifier comprises a body of high conductivity N-type germanium having on one face thereof a thin layer of low conductivity N-type germanium across which layer there extends a zone of P-type germanium, the P-type zone contacting or extending to the high conductivity body. The emitter and collector bear against the thin layer, on opposite sides of the P zone, and the base connects to this zone. An auxiliary electrode contacts the zone, advantageously between the emitter and collector, and has applied thereto an adjustable or variable potential to control the flow of holes between the emitter and collector.

The invention and the above noted and other features thereof will be understood more clearly and fully from the following detailed description with reference to the accompanying drawing, in which.

Figure 1:
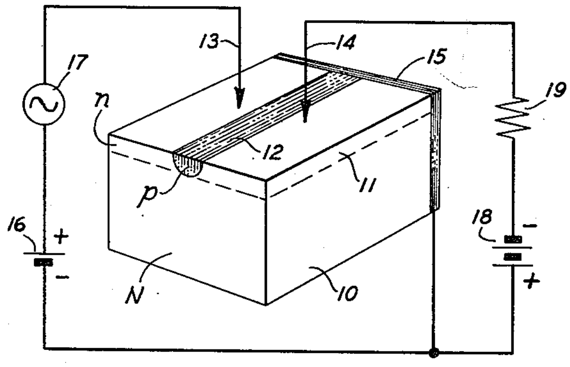
Fig. 1 is in part a perspective view of a semiconductor device and in part a circuit diagram, showing one illustrative embodiment of this invention.

In the drawing, for the sake of clarity, the semiconductor bodies have been shown to a greatly enlarged scale. The magnitude of the enlargement will be appreciated from dimensions of typical devices given hereinafter. Also in the drawing for ease of identification, zones or regions of different conductivity type or conductivity are designated by appropriate characters. Specifically, high conductivity $n$-type material is designated by N, low conductivity n-type material is indicated by the letter $n$ and $p$-conductivity type material is identified by the letter $p$.

Referring now to the drawing, the semiconductor device illustrated in Fig. 1 comprises a body 10 of high conductivity $n$-type material having on one surface thereof a thin layer 11 of low conductivity $n$-type material. The layer 11 has therein and extending entirely thereacross a region or zone 12 of $p$-type material.

The low conductivity layer 11 may be formed on the body 10 is various ways. For example, it may be formed by depositing, as by vapor deposition, a film of an acceptor material such as gold or aluminum upon the body 10 and then heating the assembly to diffuse the acceptor material into the body whereby the conductivity of a surface layer is substantially reduced and the low conductivity $n$-type layer is formed. The zone or region 12 may be formed in an analagous manner. Specifically and for example, an acceptor material such as gold or aluminum may be deposited upon the layer 11 through a restricted aperture in a mask and the assembly heated to diffuse the acceptor material into the layer 11 thereby to form the $p$-type zone or region 12.

In a typical device wherein the semiconductive material is germanium, the body may be .050 by .050 by .025 inch. The layer 11 may be .0005 inch thick and the zone or region 12 may be .001 inch wide.

Bearing against the low conductivity layer 11 on opposite sides of the region or zone 12 are an emitter 13 and collector 14, which may be point contacts of Phosphor bronze. The spacing of the emitter and collector from one another advantageously is very small, for example of the order of .002 inch. A base connection 15, which may be a plating of copper or rhodium, contacts the body 10, layer 11 and zone or region 12.

In the operation of the device, the emitter is biased in the forward direction relative to the base 15 as by a source 16, the biasing potential being, in the case of germanium, in the order of one volt or less. Signals to be translated are impressed between the emitter 13 and base 15 as from a source 17. The collector 14 is biased in the reverse direction relative to the base 15 as by a suitable source 18, the biasing potential being of the order of 10 volts or more. A load, indicated generally by the resistor 19, is included in the collector circuit. Amplified replicas of signals impressed by the source 17 are obtainable in the load 19.

At the junctions between the body 10, layer 11 and zone or region 12 it will be appreciated that potential barriers are obtained by virtue of the differences in conductivity or conductivity type. The relations of the energy levels at the several barriers are such that holes injected at the emitter 13 are repelled from the body 10; thus, the holes injected at the emitter 13 which flow through the $p$ zone 12 to the collector are constrained to follow paths within the layer 11 which are of substantially equal lengths. Thus, the hole transit times are substantially uniform and phase differences in the time of arrival of the holes in the region of the collector 14 are minimized. Consequently, cancellation effects also are minimized and a high maximum operating frequency is attainable.

It will be appreciated also that the nature of the energy levels at the junction between the layer 11 and body 10 is such as to inhibit the flow of electrons from the collector 14 around the $p$ zone 12 to the vicinity of the emitter, hence feedback from collector to emitter is reduced and the operating stability of the device is enhanced.

Figure 2:
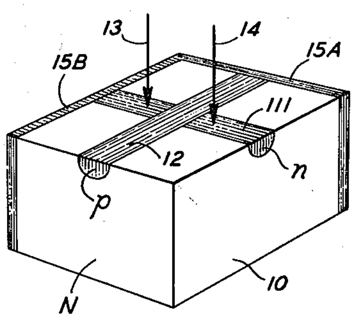
Fig. 2 is a perspective view of a semiconductor translating device illustrative of another embodiment of this invention.

In the device illustrated in Fig. 2, the high conductivity $n$-type body 10 has in one face portion thereof crossed low conductivity $n$ and $p$-type zones or regions 111 and 12, respectively. The emitter and collector 13 and 14, respectively bear against the zone or region 111 on opposite sides of the $p$ zone or region 12. The base connection is constituted by two parts 15A and 15B connected to the body and to the zones 12 and 111, respectively. A particular feature of the construction illustrated in this figure is the further confinement, laterally, of the hole flow from emitter to collector by the low conductivity channel 111 with a consequent enhancement in the frequency response characteristic of the device.

Figure 3:
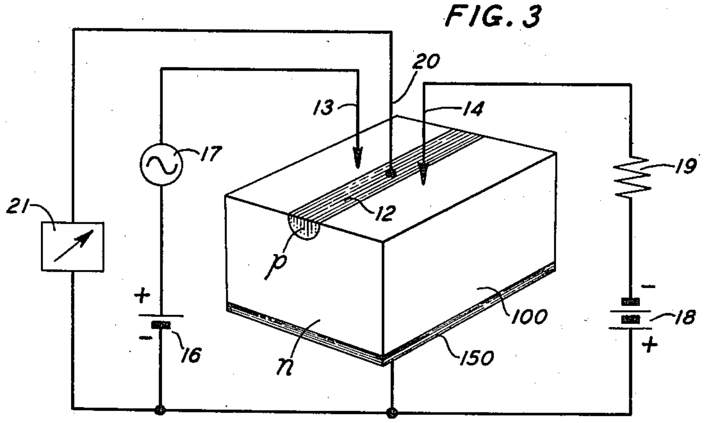
Fig. 3 shows, in like manner to Fig. 1 an amplifier constructed in accordance with this invention and including an auxiliary electrode associated with the semiconductor body.

In the device illustrated in Fig. 3, the body 100 advantageously of low conductivity $n$-type material, has therein at one face a $p$-type zone 12. The emitter and collector 13 and 14, respectively, bear against this face on opposite sides of the zone 12. The base connection 150 is made to the opposite face of the body. An auxiliary or control electrode or connection 20 which may be a point contact or relatively large area contact is made to the zone 12 and advantageously aligned with the emitter and collector. The auxiliary or control electrode 20 is connected to the base 150 through a source of adjustable or variable potential 21.

The auxiliary or control electrode 20 serves to bias the $p$ zone 12 relative to the body 100 thereby to control the gain of the device. Specifically, holes which are injected at the emitter 13 drift or are drawn into the P channel 12. The number of such holes which traverse the zone 12 and flow to the collector 14 will be determined by the bias upon the zone 12. If a high negative bias is placed upon this zone or region 12 the hole flow to the collector will be reduced. Conversely, a positive bias upon this zone or region 12 enhances the hole flow to the collector. Thus, the bias upon the zone 12, depending upon its polarity, either assists or opposes the attraction of holes toward the collector 14 due to the nature of the energy levels at the junction between zone 12 and the body 100. Further, and in analogous manner, it effects the electron flow from the collector 14 toward the emitter 13 and thus affords a control of the positive feedback impedance of the device.

The bias upon the zone or region 12 applied upon the source 21 may be set at a desired value. Alternatively, the voltage of this region 12 may be varied periodically, as by a signal, to produce intermodulation in conjunction with the signal applied from the source 17.

Figure 4:
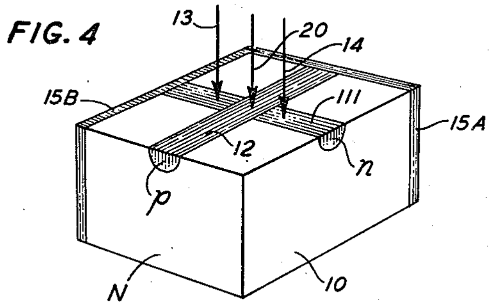
Fig. 4 is a perspective view illustrating a modification of the embodiment shown in Fig. 2.

The embodiment of this invention illustrated in Fig. 4 is similar to that illustrated in Fig. 2 but includes in addition an auxiliary or control electrode 20 bearing against the P zone or region 12. This auxiliary or control connection 20 functions in like manner to the connection 20 in the device illustrated in Fig. 3 and described hereinabove.

Although the invention has been described with particular reference to semiconductor bodies of germanium of high conductivity, it will be understood, of course, that it may be practiced also with bodies of other materials and different specific conductivity and conductivity type relationships. For example, silicon may be utilized as well as germanium. Also, for example, the body 10 or 100 may be of $p$-conductivity type, and the zone or region 12 may be of $n$-conductivity type. In such case, the polarities of the biases upon the emitter and collector should be reversed from those shown in the drawing inasmuch as the electrical carriers flowing from emitter to collector are electrons.

It will be understood also that although specific embodiments of this invention have been shown and described, they are but illustrative and various modifications may be made therein without departing from the scope and spirit of this invention.

What is claimed is:

1. A signal translating device comprising a body of semiconductive material of one conductivity type having in one surface portion thereof a zone of the opposite conductivity type extending across said surface portion, a base connection to said body, emitter and collector connections to said body on opposite sides of said zone, and an auxiliary electrode connected to said zone.

2. A signal translating device comprising a body of $n$-conductivity type semiconductive material having in one surface portion thereof a zone of $p$-conductivity type semiconductive material extending across said portion, a base connection to said body, emitter and collector connections to said portion on opposite sides of said zone, and a control electrode connected to said zone.

3. A signal translating device comprising a body of $n$-conductivity type germanium having in one surface portion thereof a zone of $p$-conductivity type germanium extending across said portion, a base connection to said body, emitter and collector connections to said portion on opposite sides of said zone, and a control electrode connected to said zone.

4. A signal translating device comprising a body of semiconductive material of one conductivity type and having in one surface portion thereof a first zone of said type but of different conductivity than the remainder of said body, said body having also in said portion a second zone of the opposite conductivity type and intersecting said first zone, emitter and collector connections to said first zone on opposite sides of said second zone, and a base connection to said first zone.

5. A signal translating device comprising a body of high conductivity $n$-type semiconductive material having in one surface portion thereof a first zone of low conductivity $n$-type semiconductive material and having also in said portion a second zone of $p$-type semiconductive material, intersecting said first zone, emitter and collector connections to said first zone on opposite sides of said second zone, and a base connection to said first zone.

6. A signal translating device in accordance with claim 5 comprising a control electrode connected to said second zone.

7. A signal translating device comprising a body of high conductivity $n$-type germanium having in one surface portion thereof a first zone of low conductivity $n$-type germanium and having also in said portion a second zone of $p$-type germanium, intersecting said first zone, emitter and collector connections to said first zone on opposite sides of said second zone, and a base connection to said first zone.

8. A signal translating device comprising a body of semiconductive material of one conductivity type having in one face portion thereof a channel shaped zone of semiconductive material of the opposite conductivity type, said body having also in said portion, on opposite sides of said zone and contiguous therewith a pair of channel shaped regions of semiconductive material of said one type and of conductivity lower than the body proper, a base connection to said zone and regions, and emitter and collector connections respectively to said regions.

9. A signal translating device in accordance with claim 8 comprising an auxiliary electrode connected to said zone.

10. A signal translating device comprising a body of high conductivity $n$-type germanium, said body having in one face portion thereof a first restricted zone of $p$-type germanium, and having also in said portion on opposite sides of said zone and contiguous therewith a pair of aligned restricted zones of low conductivity $n$-type germanium, a base connection to said first and pair of zones, and emitter and collector connections respectively to said pair of zones.

11. A signal translating device comprising a body of semiconductive material having therein two regions of one conductivity type separated by a zone of the opposite conductivity type, a base connection to said body, emitter and collector connections to said two regions respectively, and a control electrode connected to said zone.

WILLIAM G. PFANN.

No references cited.